(12) United States Patent
Varnica et al.

(10) Patent No.: US 8,296,637 B1
(45) Date of Patent: Oct. 23, 2012

(54) CHANNEL QUALITY MONITORING AND METHOD FOR QUALIFYING A STORAGE CHANNEL USING AN ITERATIVE DECODER

(75) Inventors: Nedeljko Varnica, Sunnyvale, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 545 days.

(21) Appl. No.: 12/563,964

(22) Filed: Sep. 21, 2009

Related U.S. Application Data

(60) Provisional application No. 61/098,850, filed on Sep. 22, 2008.

(51) Int. Cl.
*H03M 13/03* (2006.01)
(52) U.S. Cl. ............................................. 714/794
(58) Field of Classification Search .................. 714/786, 714/792, 793, 794
See application file for complete search history.

(56) References Cited

U.S. PATENT DOCUMENTS

| | | | | |
|---|---|---|---|---|
| 6,671,852 B1 * | 12/2003 | Ariel et al. | ..................... | 714/793 |
| 7,051,268 B1 * | 5/2006 | Sindhushayana et al. | .... | 714/786 |
| 7,584,407 B2 * | 9/2009 | Kim | ............................... | 714/794 |
| 8,086,928 B2 * | 12/2011 | Jalloul et al. | .................. | 714/752 |
| 8,112,698 B2 * | 2/2012 | Nguyen | ........................ | 714/792 |

* cited by examiner

*Primary Examiner* — James C Kerveros

(57) ABSTRACT

Monitors, architectures, systems and methods for determining one or more quality characteristics of a storage channel. The monitor generally includes an iterative decoder configured to decode data from the storage channel and generate information relating to a quality metric of the storage channel and/or the iterative decoder, a memory configured to store a threshold value for the quality metric, and a comparator configured to compare the threshold value with a measured value of the quality metric. The monitor enables accurate determination of storage channel quality without use of conventional Reed-Solomon metrics.

20 Claims, 14 Drawing Sheets

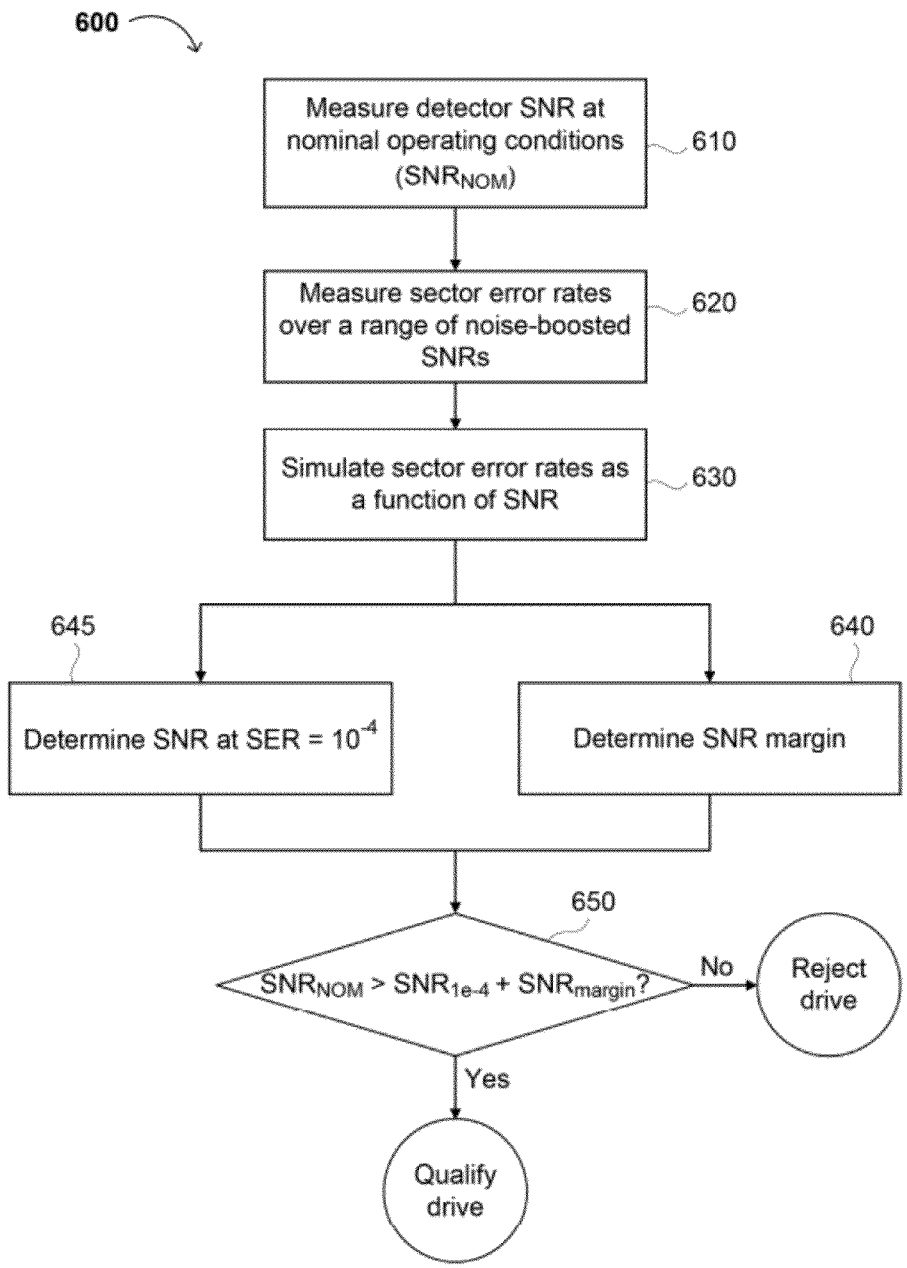

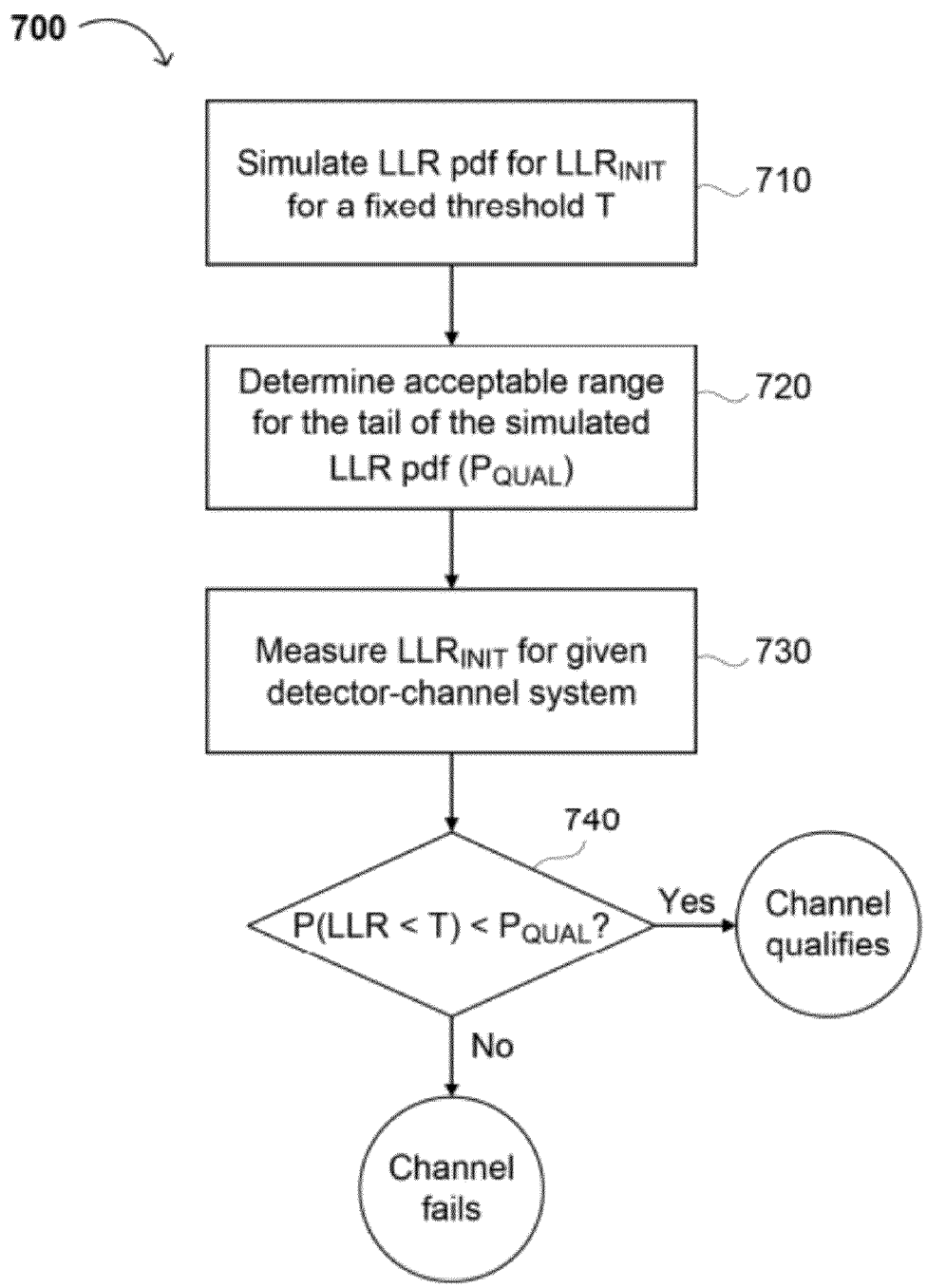

CHANNEL QUALITY MONITORING AND METHOD FOR QUALIFYING A STORAGE CHANNEL USING AN ITERATIVE DECODER

RELATED APPLICATIONS

This application claims the benefit of U.S. Provisional Application No. 61/098,850, filed Sep. 22, 2008, incorporated herein by reference in its entirety.

FIELD OF THE INVENTION

The present disclosure generally relates to the field of storage channels (e.g., hard disk drives, optical storage media such as compact discs and digital versatile discs, solid state memory drives such as flash memory drives, apparatuses for reading such drives and discs, etc.). More specifically, embodiments of the present disclosure pertain to circuits, architectures, systems, methods, algorithms and software useful for qualifying a storage channel using information provided by an iterative decoder, the information relating to a quality of the channel.

BACKGROUND

In many conventional data transmission channels, external influences (such as noise) can introduce errors into the data. Errors in reading or processing received data are often detected and/or corrected by encoding the user data with an error correction code (ECC) encoder, and then transmitting the encoded data. The encoded data often consists of the original user data and parity data produces by the ECC encoder. The user data is decoded at the receiving end via a decoder that includes an ECC decoder. One common system encodes the data and the ECC according to a Reed-Solomon code, and the number of corrections performed by the outer Reed-Solomon decoder can be monitored, thereby providing a useful parameter for gaining insight into data and/or channel reliability. Such systems are commonly used when reading a mass storage medium (e.g., a hard disk or optical disk).

However, transmitting ECC encoded data reduces the proportion of channel bandwidth dedicated to data transmission, thereby increasing overhead. To increase the gain, or to reduce the amount of ECC encoded data, an iterative encoding and decoding system (e.g., a "Reed-Solomon-less" coding system) has been introduced. Referring to FIG. 1, an iterative encoder 10 writes iteratively encoded data to hard disk 20, where the encoded data are stored.

The data stored on hard disk 20 are read by iterative decoder 30, which includes a channel detector 32 and a code decoder 34. The soft channel detector 32 may employ, for example, a soft output Viterbi algorithm (or other suitable soft channel detector such as BCJR detector) to enable correction of errors in the data read from the hard disk 20. The code decoder 34 feeds the decoding output back to channel detector 32 to improve the accuracy and/or reliability of the decoded data output from the iterative decoder 30.

In the past, one procedure for determining the reliability and/or predicting the drive performance of a storage channel employing a RS code with ECC relied primarily on the sector error rate (SER) or sector failure rate of the channel, for some small value of RS correction power T. The RS correction power T was determined experimentally, during testing of the storage channel. The drive was disqualified if $SER(T) > SER_{qual}$, where $SER_{qual}$ was determined empirically. With the introduction of iterative coding solutions for reading and/or decoding data from certain data transmission channels, however, one or more useful parameters for determining the quality of the channel (i.e., the number of corrections performed by the outer Reed-Solomon decoder with appropriately adjusted correction power T) may not be available.

SUMMARY

Embodiments of the present disclosure relate to circuitry (e.g., a quality monitor), architectures, systems, methods, algorithms and software for determining one or more qualities of a storage channel using an iterative decoder. The quality monitor can comprise an iterative decoder configured to decode data from a storage channel and generate information relating to a quality metric; a memory configured to store a threshold value for the quality metric; and a comparator configured to compare the threshold value with a measured value of the quality metric to determine a quality of the storage channel and/or the iterative decoder. In various embodiments, the iterative decoder comprises a detector and parity check logic. The detector can be configured to receive sampled data from the storage channel, and the parity check logic can be configured to correct errors in the sampled data from parity bits received from the storage channel. In other embodiments, the quality monitor further comprises a second memory configured to store the measured value of the quality metric, and/or a counter configured to count a number of iterations of the iterative decoder. The architectures and/or systems generally comprise those that include a circuit embodying one or more of the inventive concepts disclosed herein. For example, a storage system can comprise the present quality monitor and a storage channel communicatively coupled to the quality monitor.

A further aspect of the disclosure concerns a method of determining reliability of a storage medium, generally comprising determining a threshold value for a quality metric of the storage medium; iteratively decoding data from the storage medium at one or more nominal operating conditions; measuring from the iteratively decoded data or from information defining the iteratively decoded data an actual value of the quality metric for the storage medium at the nominal operating condition(s); and determining whether the actual value exceeds the threshold value. In one embodiment, determining the threshold value can comprise simulating an error rate metric as a function of the quality metric. In addition, the method can further comprise increasing an error rate of data from the storage medium. The algorithms and/or software are generally configured to implement one or more of the embodiments of the present method(s) and/or any process or sequence of steps embodying the inventive concepts described herein. However, in this context, the term "algorithm" is meant in a general sense (e.g., a logical sequence of steps taken to perform one or more mathematical and/or computational processes and/or operations), rather than a more specific, technical sense (such as "Viterbi algorithm," as discussed below).

The present disclosure enables circuits configured to read a storage channel using iterative decoding to collect and evaluate information regarding a quality of the storage channel. The present disclosure can also provide reliable and/or accurate procedures for qualifying storage channels (e.g., hard disk drives, optical storage media and apparatuses for reading the same, etc.) without using conventional metrics, such as the error correction power of a Reed-Solomon ECC code or the number of errors corrected by such a Reed-Solomon ECC

BRIEF DESCRIPTION OF THE DRAWINGS

FIG. 12 is a flow diagram of another embodiment of a process for qualifying a storage channel based on detector SNR information.

FIG. 14 is a flow diagram of an embodiment of a process for qualifying a storage channel based on LLR information.

DETAILED DESCRIPTION

Figure 1:
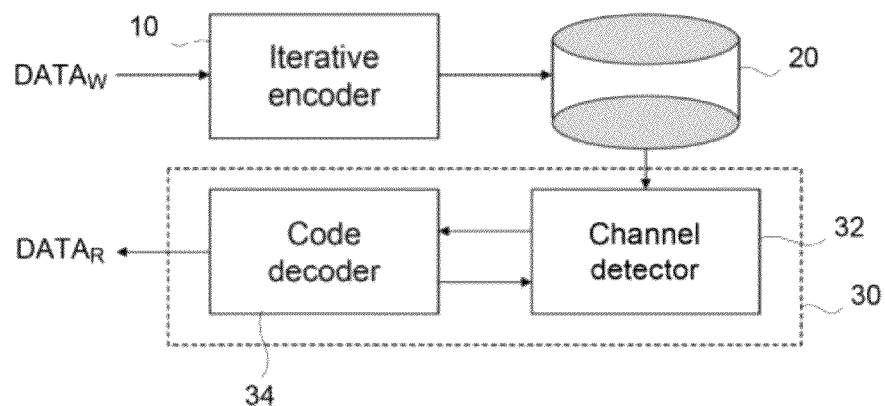
FIG. 1 is a diagram showing an iterative encoding and decoding system for storing data in and reading data from a data storage channel.

Reference will now be made in detail to various embodiments of the disclosure, examples of which are illustrated in the accompanying drawings. While the disclosure will be described in conjunction with the exemplary embodiments provided below, the embodiments are not intended to limit the disclosure. On the contrary, the disclosure is intended to cover alternatives, modifications and equivalents that may be included within the scope of the disclosure as defined by the appended claims. Furthermore, in the following detailed description, numerous specific details are set forth in order to provide a thorough understanding of the present disclosure. However, the present disclosure may be practiced without these specific details. In other instances, well-known methods, procedures, components, and circuits have not been described in detail so as not to unnecessarily obscure aspects of the present disclosure.

Some portions of the detailed descriptions which follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, algorithm, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or logic circuit. It has proven convenient at times, principally for reasons of common usage, to refer to these signals as bits, waves, waveforms, streams, values, elements, symbols, characters, terms, numbers, or the like.

All of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer, data processing system, logic circuit or similar processing device (e.g., an electrical, optical, or quantum computing or processing device) that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "clock," "time," "rate," "period" and "frequency" are generally used interchangeably herein, but are generally given their art-recognized meanings. Also, for convenience and simplicity, the terms "data," "data stream," "waveform" and "information" may be used interchangeably, as may the terms "connected to," "coupled with," "coupled to," and "in communication with" (which terms also refer to direct and/or indirect relationships between the connected, coupled and/or communication elements unless the context of the term's use unambiguously indicates otherwise), but these terms are also generally given their art-recognized meanings. In addition, the terms "iteration" generally refer to a single decoding sequence (e.g., from starting to ending state), but the term "iterative" generally refers to a process that is, under certain conditions, repeated (e.g., performed a second, third or further time) in a cyclic manner until one or more predetermined conditions are met.

Some embodiments of the present quality monitor and method of qualifying channels (or data from a channel) may operate on a block code (e.g., a Reed-Solomon code), while others may operate on a convolutional code (e.g., a (d,k) code, etc.). However, in further embodiments, the present quality monitor and method(s) may be configured to operate on either or both of a block code and/or a convolutional code. Furthermore, in some embodiments, either the block code or the convolutional code may be concatenated with one or more further block codes and/or convolutional codes (e.g., a so-called "dual k" code).

The disclosure, in its various aspects, will be explained in greater detail below with regard to exemplary embodiments.

A First Quality Monitor

Figure 2:
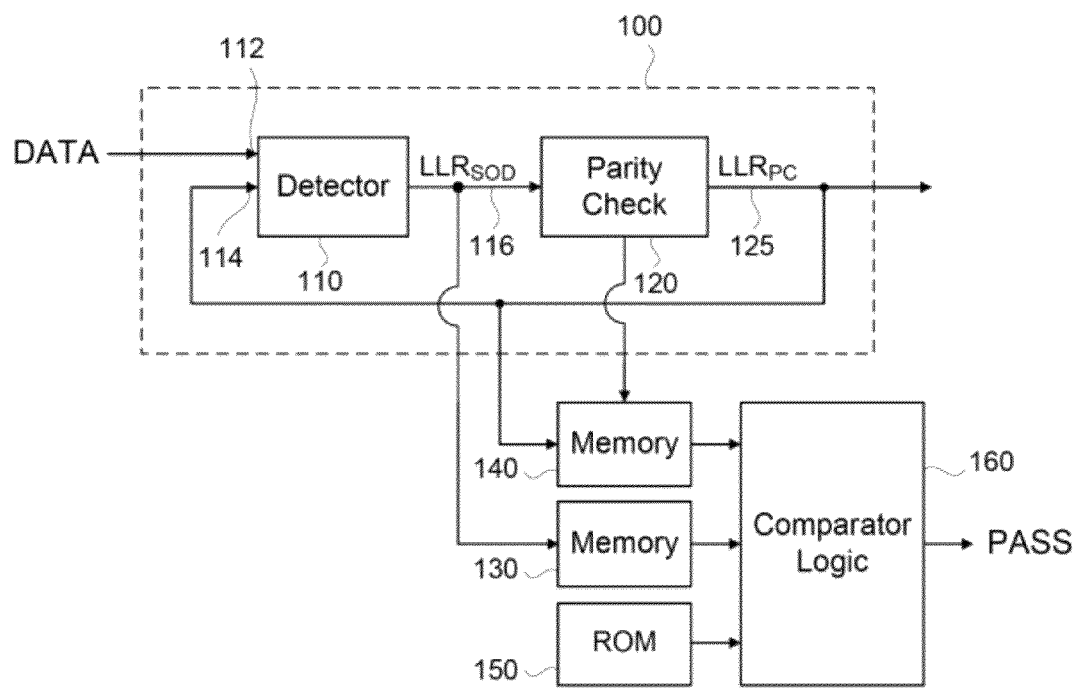
FIG. 2 is a block diagram showing an embodiment of an iterative decoder and LLR quality monitor.

FIG. 2 shows a first embodiment of an iterative decoder 100, including a soft detector 110 and a parity check 120. In one embodiment, the detector 110 executes a soft output Viterbi algorithm (SOVA) and/or comprises a circuit and/or logic (e.g., a soft channel detector) configured to carry out the same. In one example, the detector 110 may assume that there are at most a certain number of possible errors per unit length of code (e.g., a word, a byte, a block of fixed length, etc.). In various embodiments, the parity check 120 may comprise single bit parity check logic or a low density parity check (LDPC) logic. The single bit parity check logic may be configured to determine the identity of a single parity bit (where the encoded data in the channel stores or transmits a single parity bit with each unit length of encoded data, where the unit length is predetermined [e.g., a byte or word of data]) and compare the determined parity bit to the received single parity bit. The low density parity check logic can perform the same functions on parity bits encoded according to a LDPC code (where LDPC code and the density or number of parity bits per unit length of data are known or predetermined). Alternatively, the detector 110 and parity check logic 120 can decode and error-check data and parity bits encoded in accordance with a turbo code.

The detector 110 receives data samples (e.g., from a finite impulse response [FIR] filter; not shown) at input 112 and feedback information from the parity check 120 at input 114. The detector 110 provides a first logarithmic likelihood ratio (LLR) metric 116 representing soft information regarding the output of the detector 110. The parity check 120 receives the first LLR metric 116 from the detector 110 and provides a second LLR metric 125. The feedback information is generally (but not necessarily) the second LLR metric 125 or other output of the parity check 120. It is well within the abilities of one skilled in the art to design and use such detector and/or parity check logic.

After the detector 110 decodes each iteration, LLRs can be taken at the output 116 of detector 110 (e.g., the input to parity check 120) or at the output 125 of parity check 120 (e.g., in the feedback path to detector 110). The LLRs can be stored in memory 130 or 140, depending on the block (e.g., detector 110 or parity check 120) from which the LLRs were taken. The LLR stored in memory 130 or 140 can be compared with the threshold (stored, for example, in ROM 150) in comparator logic 160 to determine whether the storage channel transmitting the data is reliable. If the channel is reliable, the output PASS of the comparator logic 160 has a first predetermined state (e.g., a high binary logic state, or "1"), and if the channel is not reliable, the output PASS of the comparator logic 160 has a second predetermined state (e.g., a low binary logic state, or "0").

In one example, the quality monitor metric is the soft channel detector LLR after the initial channel iteration (e.g., stored in memory 130), as the LLR of the initial channel iteration ($LLR_{INIT}$) equals $LLR_{SOD}$ (or its absolute value; i.e., $LLR_{INIT}=|LLR_{SOD}|$), and either value ($LLR_{INIT}$ or $LLR_{SOD}$) can be used as the parameter value for comparison with the threshold. Alternatively, the soft channel detector LLRs after multiple and/or successive channel iterations ($LLR_{SOD}$) or the LLRs at the output of parity check 120 (i.e., $LLR_{PC}$) may be stored in the memory 130 and compared with the predetermined threshold. When a sufficiently large number of $LLR_{INIT}$ values (or $LLR_{SOD}$ or $LLR_{PC}$ values) in the memory 130 exceed a predetermined threshold (e.g., a predetermined LLR threshold value stored in ROM 160), the quality of the channel (or of the data) is sufficiently reliable for further use, and an indicator signal PASS may be activated. This indicates that the storage channel is acceptable, and can be sold in the marketplace or otherwise used in a larger system. If an insufficient number of $LLR_{INIT}$ values exceed the threshold, then one may determine that the quality of the channel (or of the data) is not sufficiently reliable for further use, and the indicator signal PASS may be deactivated, thereby indicating that the storage channel is unacceptable. Alternatively, one can continue to iteratively decode data received from the storage channel to see if the channel may be considered reliable according to another quality metric (e.g., using the channel quality monitor).

Figure 3A:
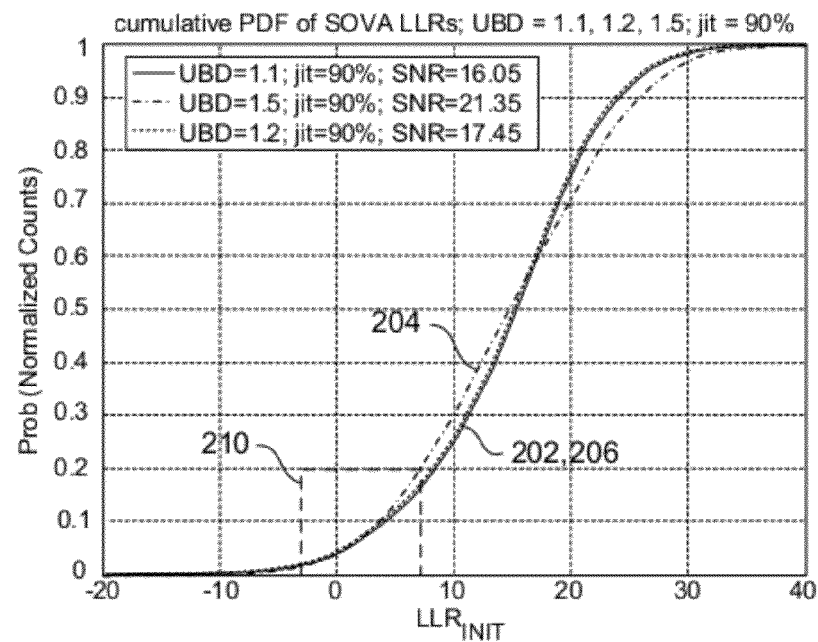
FIGS. 3A-3B are graphs showing the probability of LLR counts (normalized to 1) under a given set of channel conditions as a function of $LLR_{INIT}$.

The threshold can be determined empirically by simulation. Based on known or experimentally-derived equations, and as shown in FIG. 3A, graphs 202, 204, 206 of the probability (normalized to 1) of the LLR counts under a given set of channel conditions as a function of LLR can be plotted for each of a variety of channel parameter values. The channel parameters for which values can be varied include signal-to-noise ratio (SNR), jitter percentage (jit), user bit density (UBD), signal drift rate, signal attenuation, error correction strength of the parity bits or other ECC in the code, etc. In the graphs of FIG. 3A, the sector error rate is presumed to be 0.008 and the jitter is held at 90% (e.g., the period of the data signal can vary up to 10%), but UBD varies from 1.1 (line 202) to 1.5 (line 204), and SNR ranges from 16.05 (line 202) to 21.35 (line 204). As one can infer, the results do not vary significantly across these variable parameter values.

FIG. 3A shows the distribution (histograms) of LLRs for different values of the threshold. For example, the curve 204 indicates that approximately 30% of LLRs ($LLR_{INIT}$) have LLR values less than +10. In other words, the probability corresponding to LLR=+10 is Prob=0.3. Similarly, the percentage of LLRs that are smaller than 0 is approximately 3% (Prob=0.03). The LLR histograms in FIG. 3A were adjusted for sign. In the plot 200, the positive LLRs implicate correct sign (agreement with the transmitted/written bit) and the negative LLRs implicate incorrect sign (mismatch the transmitted/written bit). In other words, the curves 202, 204 and 206 in FIG. 3A are probabilities of LLRs conditioned on the written/transmitted bit (e.g., $LLR(b_k|b_k=0)$ and $LLR(b_k|b_k=1)$, where $b_k$ is a written bit). One can also use $LLR_{INIT}=|LLR|$ as the metric if the transmitted/written bits are not known during the channel qualification procedure. In real storage channel systems, the actual transmitted written bits are generally unknown, but the transmitted bits may be calculated in a test environment using a known pseudorandom bit sequence (PRBS).

In general, relatively large LLR numbers indicate a reliable storage channel, whereas relatively small LLR numbers indicate an unreliable storage channel. For example, assuming (as discussed above) that a positive LLR sign denotes that the corresponding bit (or symbol) is correct, and that a negative LLR sign denotes that the corresponding symbol is incorrect, an $LLR_{INIT}$ of about 30 or more indicates a very reliable channel, whereas an $LLR_{INIT}$ of less than 0 (e.g., about −10 or less) indicates a clearly unreliable channel. In the example of FIG. 3A, the threshold can be selected in the region where the second derivatives of the curves (e.g., 202, 204, 206) are positive, and in one embodiment, also where the LLR is relatively high. For example, one can determine the maximum value of the second derivative, then choose a second derivative value that is a fraction or percentage of the maximum value (e.g., ½, ⅓, ¼, etc.) that provides adequate margin for error (to avoid accepting unreliable storage channels) while not inadvertently discarding as unreliable those storage channels that will perform reliably under reasonable operating conditions, then select the higher LLR value at that fraction or percentage of the second derivative.

Figure 3B:
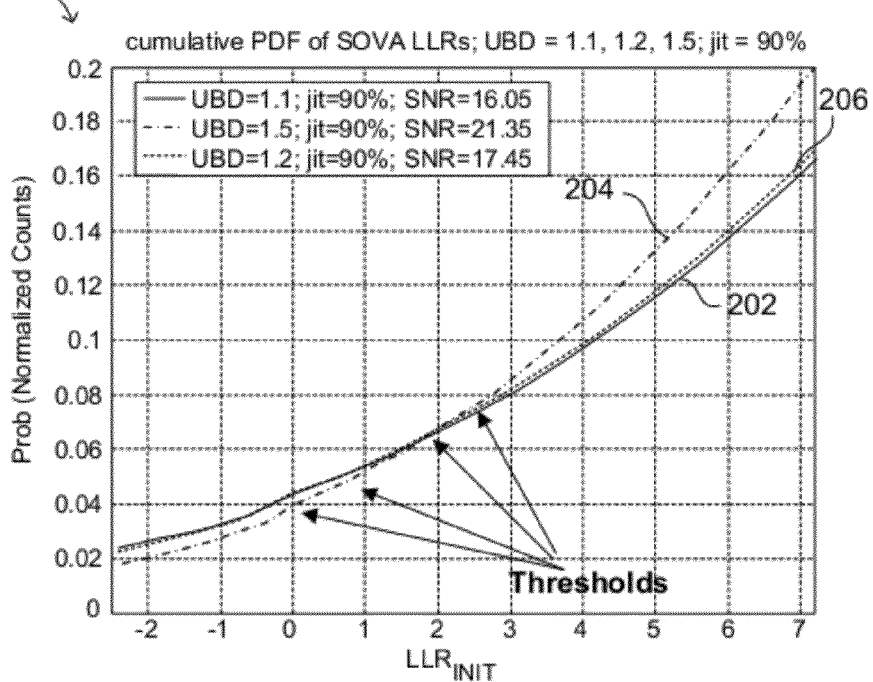

FIG. 3B is a portion 210 of the graph of FIG. 3A where the second derivative of each of the lines 202, 204, 206 is positive. While thresholds of about 0, about 1, about 2, and about 2.5 LLRs are shown, in this example, the threshold can be any value from 0 to 15 (e.g., 0 to 5). Referring back to FIG. 2, if the detector 110 produces LLRs having a relatively high value (i.e., above the threshold), then the storage channel is deemed to be reliable.

Thus, the iterative decoder 100 may calculate, obtain and compare LLR counts with a pre-specified threshold. These data, in effect, can provide a cumulative LLR probability density function. For example, such operations may allow accumulation of conditional LLRs (e.g., $LLR(b_k|b_k=0)$ and $LLR(b_k|b_k=1)$, where $b_k$ is a written bit), as shown in FIG. 3A. When the LLR probability density (or other measure of the LLR counts) is less than or equal to the threshold probability, the channel reliability is acceptable, and the channel can be qualified.

A Second Quality Monitor

Figure 4:
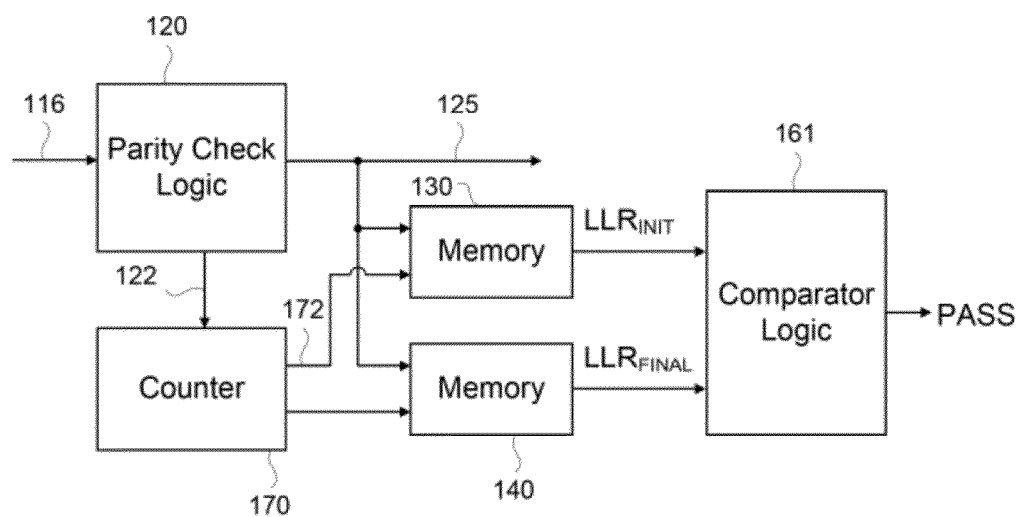
FIG. 4 is a block diagram of an embodiment of a channel quality monitor.

FIG. 4 shows a block diagram of an embodiment of circuitry for a channel quality monitor. The channel quality monitor tracks a total number of errors corrected by the iterative decoder 100 (see FIG. 2). This approach allows one to estimate the total number of errors following iterative decoding (e.g., a final Viterbi detection by detector 110 and error correction by parity check logic 120). The channel quality monitor of FIG. 4 is similar to the LLR quality monitor of FIG. 2, but for clarity, the detector 110 and feedback loop of iterative decoder 100 and the ROM 150 (FIG. 2) are omitted.

As for the LLR quality monitor of FIG. 2, parity check logic 120 outputs a series of LLRs corresponding to decoding iterations, beginning with an initial LLR value ($LLR_{INIT}$) that can be stored in memory 130 and a final LLR value ($LLR_{FINAL}$) that can be stored in memory 140. In addition, parity check logic 120 outputs an iteration count 122 to a counter 170. Counter 170 is generally a multi-bit digital counter that counts the number of decoding iterations performed by detector 110. Thus, in one alternative, the iteration count 122 may be generated in or provided by detector 110. When the counter 170 resets, an active enable signal 172 is sent to memory 130 to latch or store $LLR_{INIT}$ into the memory 130. When the counter 170 reaches its final count value (corresponding to the final iteration by detector 110), an active enable signal 174 is sent to memory 140 to latch or store $LLR_{FINAL}$ into the memory 140. Alternatively, memory 140 can receive a clock signal having a frequency substantially matching the frequency of decoding iterations, and if desired, one may use or discard the intervening LLRs between $LLR_{INIT}$ and $LLR_{FINAL}$.

The LLR obtained after the final iteration ($LLR_{FINAL}$, stored in memory 140) can be compared to the initial LLR ($LLR_{INIT}$, stored in memory 130) by comparator logic 160'. When $LLR_{FINAL}$ differs from $LLR_{INIT}$ by a value greater than a predetermined threshold (e.g., corresponding to a difference in the iteratively decoded data of 100-500 bits or more in a 5000-bit sample), one may conclude that the initial signal quality was poor, and that the storage channel is unreliable. On the other hand, when the $LLR_{FINAL}$ differs from the $LLR_{INIT}$ by a value less than the predetermined threshold (e.g., corresponding to a difference of 50, 10, 5 bits or less in the 5000-bit sample) and/or if the final signal converges to a valid signal (e.g., a valid code word according to coding constraints and valid decoding parameters), one may conclude that the initial signal quality was good, and that the storage channel is reliable. Counting the number of different LLR values can also be done over a plurality of blocks (as opposed to counting over a single block, such as the 5000-bit sample described above). For instance, a number of blocks (e.g., 100) can be iteratively decoded, and a number of differing LLRs can be determined for each block. The LLR numbers are accumulated over the 100 blocks, then the total accumulated numbers can be compared with a threshold which is adjusted for the 100 blocks (e.g., Threshold100=100*Threshold1, where Threshold1 is the threshold for one block as described above).

Thus, in various embodiments, the threshold may be a number of bits in a final iteratively decoded data signal that differ from the corresponding initial iteratively decoded data signal, as determined by corresponding LLR values (and the bit length of the data being iteratively decoded), depending on the physical system, the coding constraints, the error correction power of the parity or other ECC accompanying the data, the length of the data being decoded, and/or the desired level of channel quality. The value of the threshold may be stored in ROM (e.g., ROM 150 in FIG. 2), and comparator logic 160' can compare the output of the comparison between $LLR_{INIT}$ and $LLR_{FINAL}$ to the threshold value to generate an indicator signal PASS that has an active or first predetermined state (e.g., a high binary logic state, or "1") if the channel is determined to be reliable, and an inactive or second predetermined state (e.g., a low binary logic state, or "0") if the channel is determined to be unreliable.

A Third Quality Monitor

Figure 5:
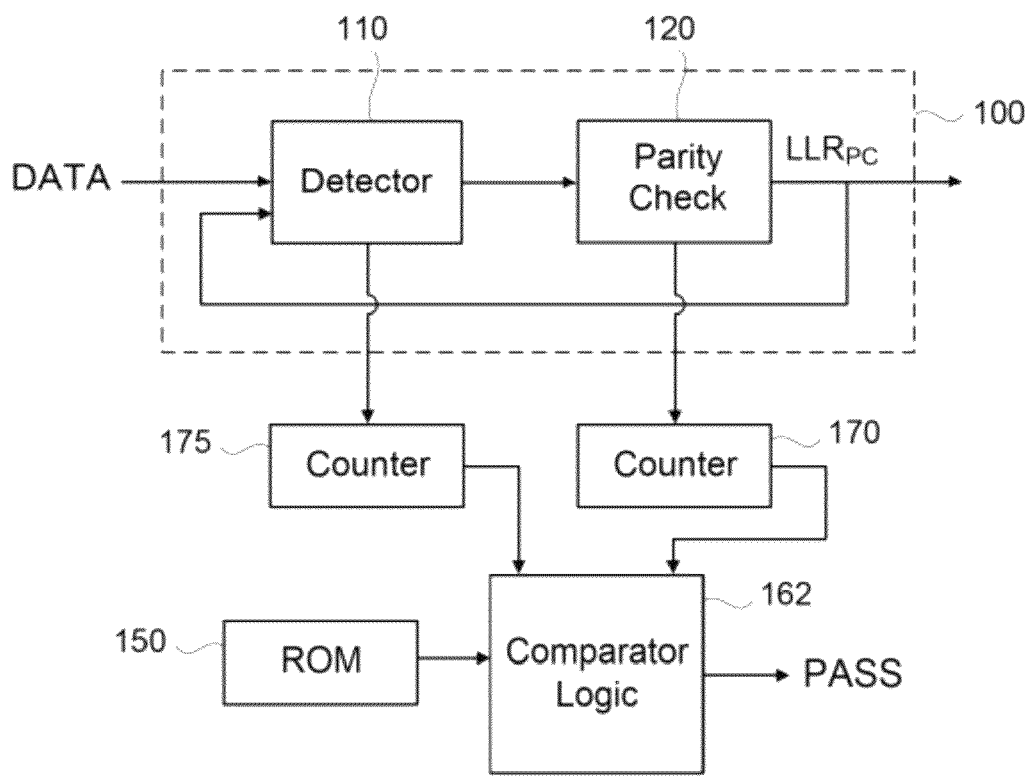
FIG. 5 is a block diagram of an embodiment of an iterative and/or iterative convergence quality monitor.

FIG. 5 shows a block diagram of an embodiment of an iterative quality monitor. The iterative quality monitor tracks or counts the number of iterations completed by iterative detector 100. Each of the detector 110 and the parity check logic 120 can perform independent decoding and/or error correction iterations on a particular block or unit of data. For example, the detector 110 can perform an initial iteration, and then parity check logic 120 can perform one or more iterations of error correction on the decoded data. For example, if the parity information calculated by parity check logic 120 from the decoded data matches the parity information received from the storage channel, then the parity check logic 120 generally performs only a single error-checking cycle. Alternatively, the parity check logic 120 may perform several iterations of error correction (e.g., from 2 to 30, or any range therein) on a unit of decoded data.

Upon completing each iteration of decoding by detector 110 (which may or may not include the initial decoding cycle), a pulse is sent to counter 175, where an iteration count is incremented. Similarly, upon each iteration of error correction by detector 110 (which may or may not include the initial error correction cycle), a pulse is sent to counter 170, where an iteration count is incremented. In one alternative, the count is incremented only if number of iterations in a particular global decoding cycle exceeds a predetermined threshold (e.g., 2, 3, 4, or more iterations), otherwise the previous count value is retained in counter 170 or 175.

The final counts are compared to a threshold value (which can be stored in ROM 150) in comparator 160". The threshold for decoding iterations can be independent of the threshold for error correction iterations, or a single threshold can be applied to both channel (detector) iterations and error correction iterations. If either or both of the counts exceed(s) the corresponding threshold, then the data and/or the storage channel may be considered unreliable, and the indicator signal PASS may be inactive or have a first predetermined state indicating an unreliable channel. On the other hand, if either or both of the counts do not exceed the corresponding threshold, then the data and/or the storage channel may be considered reliable, and the indicator signal PASS may be active or have a second predetermined state indicating a reliable channel.

In a further embodiment, the iterative quality monitor can include an iterative convergence quality monitor. The iterative convergence quality monitor can also indicate a power consumption level of the iterative detector 100. In general, the more iterations that the iterative decoder 100 has to run on average, the more power is consumed. Thus, even though a particular channel can pass the quality monitor test(s) for reliability, it may consume more power than desired for a particular application (e.g., battery-operated applications). As a result, in a further embodiment, if the total number of iterations run by the iterative decoder 100 (e.g., the detector 110, the parity check logic 120, or both) is less than a second predetermined threshold, the storage channel may be acceptable for a particular low-power application (e.g., battery-operated applications). In addition, if the total number of iterations is greater than the second predetermined threshold but less than the first predetermined threshold (e.g., for reliability), the storage channel may be acceptable for general applications, but not for low-power applications.

A Fourth Quality Monitor

Figure 6:
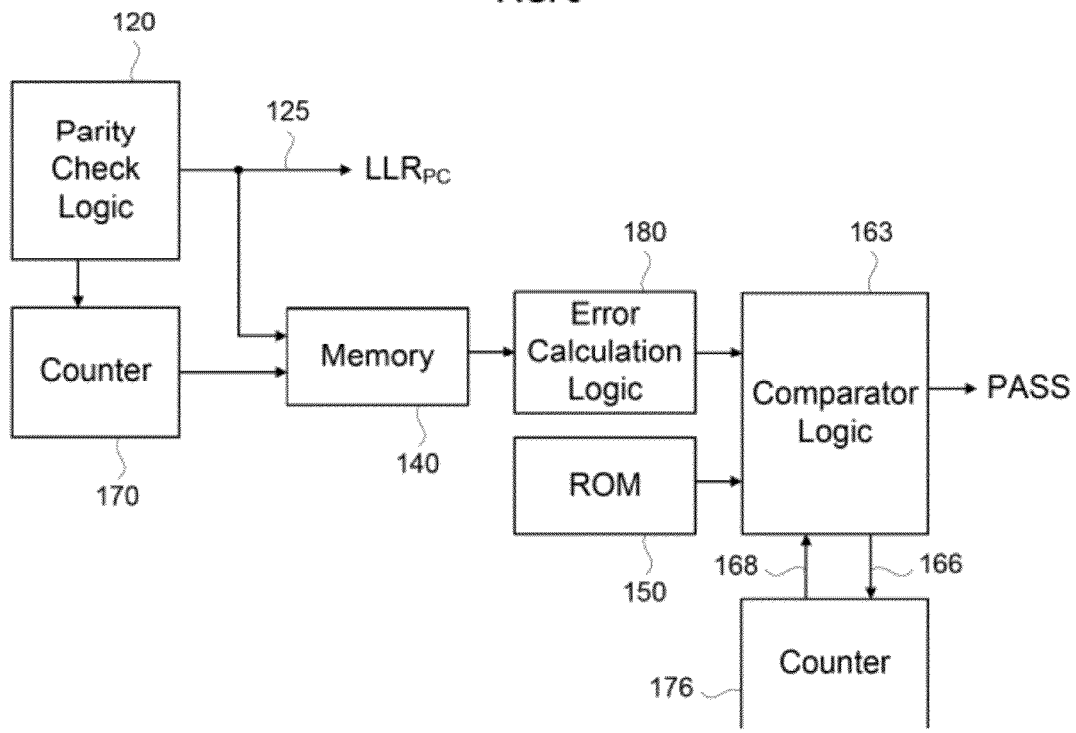
FIG. 6 is a block diagram of an embodiment of an error characteristic quality monitor.

FIG. 6 shows a block diagram of an embodiment of an error characteristic quality monitor. The error characteristic monitor tracks error patterns at the output of iterative decoder 100 (see FIGS. 2 and 5). Tracking error patterns at the output of iterative decoder 100 can be important in various operations and/or applications, such as recovery mode operations (e.g., when data decoding fails after a predetermined period of time, which may be relatively short in certain applications such as those that benefit from decoding relatively large amounts of data relatively quickly).

The error characteristic quality monitor of FIG. 6 can include a counter 170 configured to receive an iteration count from parity check logic 120, a memory 140 configured to store a final LLR (or final decoded data) after the final iteration of iterative decoder 100 (or of parity check logic 120), error calculation logic 180 configured to calculate error count (e.g., a Hamming weight and/or a syndrome) from the final LLR or final decoded data, and comparator logic 163 configured to compare the error count from error calculation logic 180 with a predetermined threshold (e.g., in the case of calculating a Hamming weight) or a maximum syndrome weight (e.g., in the case of calculating a syndrome). In real storage channel systems, the Hamming weight is generally unknown, but it can be calculated in a test environment using a known pseudorandom bit sequence (PRBS). On the other hand, when parity check logic 120 comprises low density parity check (LDPC) circuitry, the syndrome weight is generally known and/or easily calculated in real systems. If the calculated error count exceeds the threshold or syndrome weight, a pulse is sent to second counter 176.

After the entire test block of data has been decoded and the error count calculated for each decodable unit (e.g., byte or word) of data therein, the final count is sent to comparator logic 163 for comparison with a second threshold. If the number of detected errors of predetermined significance exceeds the second threshold, the storage channel is deemed to be unreliable, and an indicator signal PASS having an inactive state or a first predetermined binary logic value is generated. Alternatively, if the number of detected errors of predetermined significance does not exceed the second threshold, the storage channel is deemed to be reliable, and the indicator signal PASS has an active state or a second predetermined binary logic value. Comparator logic 163 can use the same logic gates or different, dedicated logic gates for the two comparisons. ROM 150 generally stores both thresholds (or the syndrome weight and significant error count threshold) in different locations or at different addresses. Alternatively, a separate ROM and a separate comparator can be used for the second comparison of the significant error count with the error count threshold.

In an alternative embodiment, the count in second counter 176 is incremented if the number of parity check violations (e.g., the syndrome weight, or as reflected in the Hamming weight) is below a predetermined threshold. In such an embodiment, the second counter 176 counts a number of instances where the Hamming weight or the syndrome weight is below the threshold (which represents a minimum level of unreliability), and if the count exceeds the second threshold, the storage channel is deemed to be reliable, and the indicator signal PASS has an active state or the second predetermined binary logic value. Alternatively, if the count does not exceed the second threshold, the storage channel is deemed to be unreliable, and the indicator signal PASS has an inactive state or the first predetermined binary logic value.

Figure 7:
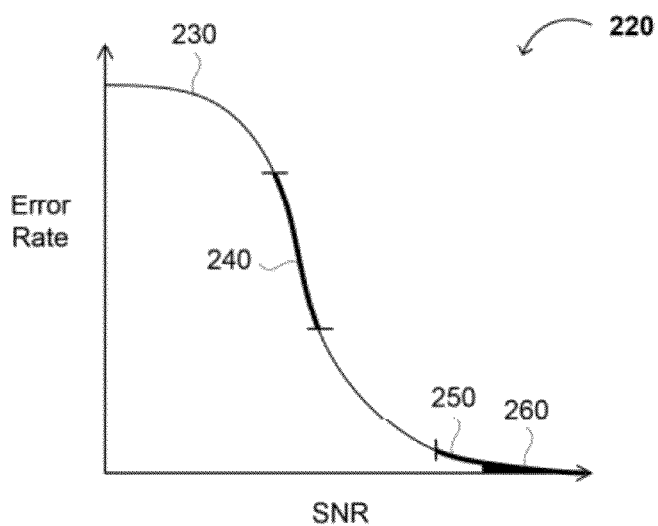
FIG. 7 is a graph showing an embodiment of an error rate as a function of the channel signal-to-noise ratio (SNR).

The error characteristic quality monitor may be helpful for characterizing relatively small, but frequent, errors by the iterative detector 100. Frequent single-bit errors, for example, are another indicator of channel unreliability. Referring now to FIG. 7, a graph 220 of the error rate as a function of channel SNR is shown in curve 230. Curve 230 includes a so-called "waterfall" region 240 and a floor region 250. It is often desired to operate storage channel media in region 260 of the curve 230, at an error rate below that of the floor region 250. Waterfall region 240 generally corresponds to relatively long error events and/or errors involving a relatively large number of bits, and floor region 250 generally corresponds to relatively isolated error events and/or errors involving a relatively small number of bits (e.g., several single-bit errors in a block). Decoding behavior demonstrating error rates above those in the waterfall region are easy to detect because the data is frequently not decoded or obtained. Errors of the types common in the waterfall region 240 can be detected by other channel quality monitors disclosed herein. Error events with small Hamming and syndrome weights are characteristic of decoding behavior in the floor region 250, which may be challenging to detect with some channel quality monitors (e.g., the LLR quality monitor), or which can be overlooked in determining the channel quality. The error characteristic quality monitor of FIG. 6 is designed to detect channel unreliability in the floor region 250 of error rate curve 230.

A Fifth Quality Monitor

Figure 8:
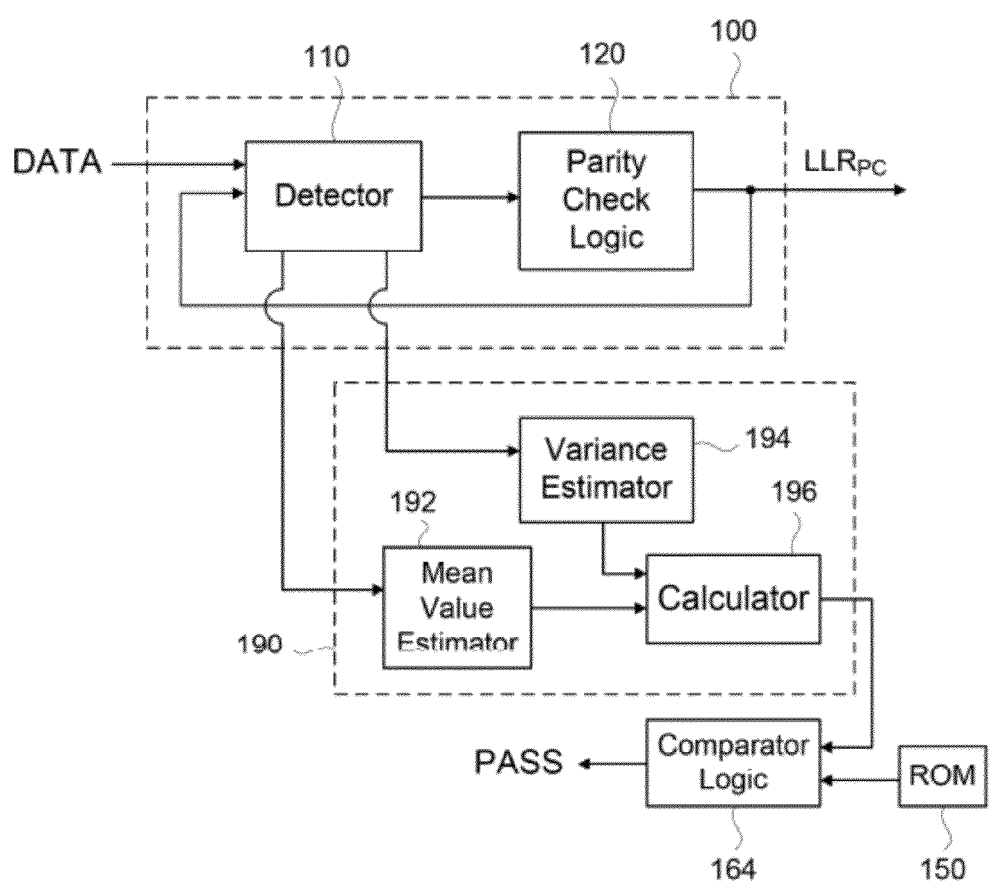
FIG. 8 is a block diagram of an embodiment of a detector SNR quality monitor.

FIG. 8 shows a block diagram of an embodiment of a detector signal-to-noise (SNR) quality monitor. The detector SNR monitor calculates the SNR of the signal received from the channel using parameters of the iterative decoder 100. If the calculated SNR exceeds a predetermined threshold, then the channel is considered reliable. If the calculated SNR does not exceed the threshold, then the channel is considered unreliable.

The detector SNR quality monitor of FIG. 8 comprises iterative decoder 100, SNR calculator 190, ROM 150 and comparator logic 164. As in FIGS. 2, 5 and 6, iterative decoder 100 comprises detector 110 and parity check logic 120. SNR calculator 190 comprises mean state value estimator 192, state variance estimator 194, and calculator 196.

By definition, the detector SNR is:

$$SNR = 10\log_{10}\left(\frac{P_{est}}{\sigma_{est}^2}\right) \quad (1)$$

where $$P_{est} = \frac{1}{N_{states}} \sum_{i=1}^{N_{states}} m_i^2 \quad (2)$$

and $$\sigma_{est} = \frac{1}{N_{states}} \sum_{i=1}^{N_{states}} \sigma_i^2 \quad (3)$$

The signal received from the storage channel can be detected via a trellis-based detector (such as Linear Viterbi detector, Non-Linear Viterbi detector, linear on non-linear soft-output Viterbi algorithm (SOVA), linear or non-linear BCJR detector). These detectors have a plurality of trellis states i. For example, such detectors can have 4 or more trellis states (e.g., $2^x$, where x is an integer of from 2 to 7). In one implementation, the signal received from the storage channel can be detected using a non-linear Viterbi detector with 16 states. In Equation (2), $P_{est}$ is the estimated power or strength of the detector signal, and $m_i$ is the estimated mean value for each state i. In Equation (3), $\sigma_{est}$ is the estimated variance of the detector signal over all of the states i in the detector trellis.

The mean and the variance may be computed from parameters of the detector 110 and the parity check logic 120. In one example, the detector 110 comprises a non-linear soft-output Viterbi (SOVA) detector and the parity check logic 120 comprises LDPC logic, in which case the estimation parameters comprise nonlinear Viterbi (NLV) parameters (e.g., $m_i$ may be the estimated NLV mean for state i). In a linear detection system, Equation (3) simplifies to a single value (or a constant), since a does not vary over the range of possible states.

SNR calculator 190 receives and uses internal states of the detector 110 (e.g., a the trellis-based non-linear Viterbi detector). For each state, one can compute or estimate the mean value and the variance. In one embodiment, the mean value estimator 192 receives from the detector 110 mean values for each internal state of the detector 110, and the variance estimator 194 receives from the detector 110 variance values for each internal state of the detector 110. Thus, in such an embodiment, the mean value estimator 192 computes the average mean value over all states to obtain $\sigma_{est}$ according to Equation (2), and the variance estimator 194 can compute the average variance over all states to obtain $\sigma_{est}$ according to Equation (3). It is within the ability of one skilled in the art to design, implement and use logic configured to perform the function(s) of the mean value estimator 192 and the variance estimator 194.

The estimated mean value and variance are sent to the calculator 196, which is configured to calculate the SNR (e.g., according to Equation (1) above). Comparator logic 164 compares the calculated SNR with a threshold SNR stored in ROM 150. If the calculated SNR exceeds the threshold, then the channel is considered reliable, and the indicator signal PASS has an active state or a first predetermined binary logic value. If the calculated SNR does not exceed the threshold, then the channel is considered unreliable, and the indicator signal PASS has an inactive state or a second, complementary predetermined binary logic value.

A First Method of Qualifying a Channel

The present disclosure further relates to methods of channel qualification. As discussed elsewhere herein, channels may include hard drive drives, hard disk arrays, optical disks (e.g., compact disks [CDs], digital versatile disks [DVDs]), solid state drives (SSDs), etc. For example, during manufacturing of hard drives, it is beneficial to develop quick and reliable qualification criteria to separate drives of marginal quality from those of acceptable quality. A new qualification procedure has been developed for systems employing iterative decoding of data received from or over such channels.

A first drive qualification procedure, based on the detector SNR quality metric and monitor discussed above, is shown in the flow diagram 300 of FIG. 9. In general, for a given family of storage channels (e.g., hard drives), at 310 simulations may be run to determine the sector error rate (SER) as a function of detector SNR. The equations and parametric model information for such simulations are generally empirically derived, and for the given family of storage channels, one may assume or determine values for certain parameters (e.g., the size of each sector, one or more common error patterns in the code, the error correction power of the parity bits in the code as a function of detector SNR, the maximum signal strength, typical worst-case noise characteristics of the channel, etc.). Such simulations can predict channel and/or detector behavior. Once the simulations are run over a sufficiently broad range of detector SNRs (e.g., providing SERs of from less than 1 [in one example, about $10^{-1}$] to less than $10^{-10}$ [in one example, less than $10^{-12}$, and in some embodiments, about $10^{-14}$ or $10^{-15}$ for example]), at 320, the results can be plotted on a graph and the elbow point of the SER curve can be identified. However, instead of running the number of blocks/sectors sufficient to obtain an SER of $10^{-14}$ or $10^{15}$ (which is typically a very large number), one can, for example, run simulations in the range of detector SNRs corresponding to SERs of from, e.g., $10^{-1}$ to, e.g., $10^{-3}$, and then estimate the elbow point by a known extrapolation method.

Figure 10A:
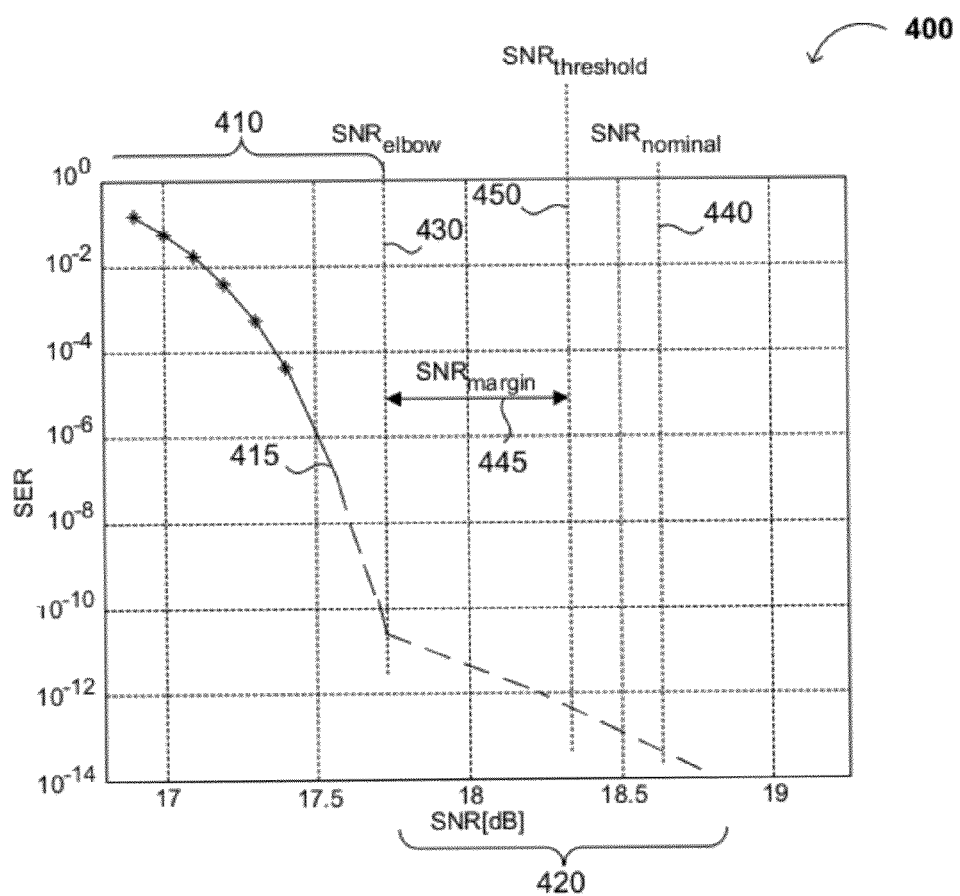
FIGS. 10A-10B are graphs illustrating calculation and/or estimation of certain terms in the flow diagram of FIG. 9.

FIG. 10A shows a graph plotting SER as a function of detector SNR (in dB). Graph 400 shows curve 415 in two regions, the waterfall region 410 and the error floor region 420. The intersection of the waterfall region 410 and the error floor region 420 corresponds to the elbow point in the SER curve, $SNR_{elbow}$ 430.

Ideally, the storage channel operates in a region of the error floor in which the SER is well below the waterfall region (1 or 2 orders of magnitude in the example of FIG. 10A). For example, the storage channel will be deemed reliable if the detector SNR is at least 1 or 2 dB away from $SNR_{elbow}$ 430, the point where error floor starts. Thus, a threshold SNR 450 can be selected in accordance with such criteria. Many (if not all) storage media can operate within acceptable limits in an SNR range close to (but greater than) that of the threshold SNR ($SNR_{TH}$ 450. As a result, at 330 in FIG. 9, an acceptable margin ($SNR_{margin}$ 445) is determined. For example, referring back to FIG. 10A, $SNR_{margin}$ 445 can be selected such that an SER improvement of at least about two orders of magnitude is provided, relative to the SER at the elbow point of curve 415. At 340 in FIG. 9, the threshold SNR ($SNR_{TH}$) for determining reliability of manufactured storage channels is calculated by adding $SNR_{elbow}$ 430 and $SNR_{margin}$ 445, and the value of the threshold SNR ($SNR_{TH}$) 450 can be stored in memory (e.g., ROM 150 in FIG. 8).

Referring back to FIG. 9, at 350, to determine whether a given storage channel is reliable, the nominal detector SNR ($SNR_{nominal}$) is measured or calculated as described herein, at substantially the same nominal operating condition(s) as used for plotting the graph 415 of FIG. 10A. For example, the detector SNR can be calculated using the detector SNR quality monitor of FIG. 8. Referring back to FIG. 9, at 360, the storage channel is qualified if $SNR_{nominal} > SNR_{threshold}$. Otherwise, the storage channel is rejected as unreliable.

Figure 9:
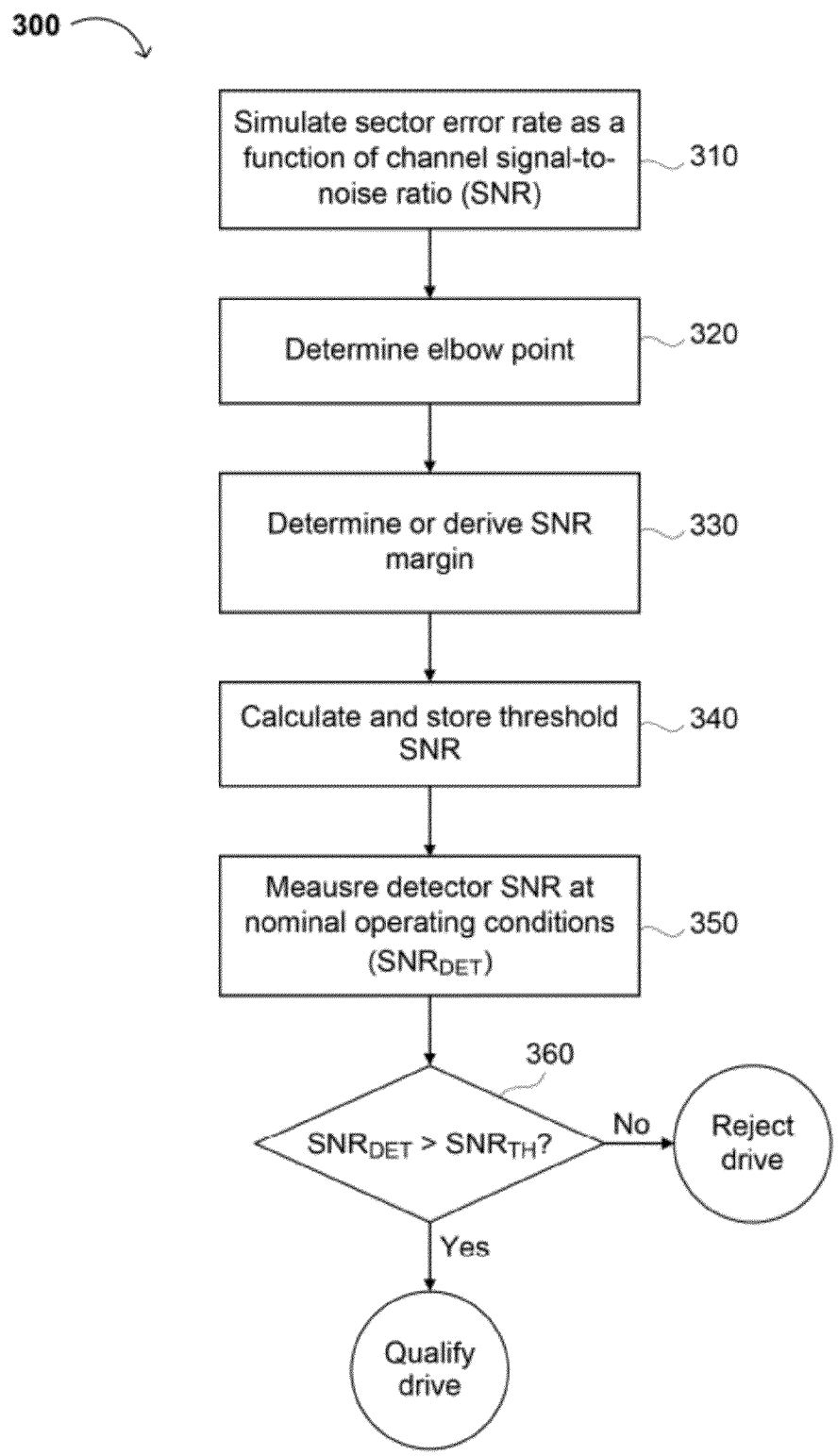
FIG. 9 is a flow diagram of an embodiment of a process for qualifying a storage channel based on detector SNR information.

Processes 310-340 of process flow 300 in FIG. 9 are done offline (e.g., prior to storage channel manufacturing), while processes 350 and 360 are performed during manufacturing. The flow 300 of FIG. 9 is particularly useful where noise characteristics do not vary significantly across storage channels manufactured according to a given manufacturing process or technology.

A Method and Circuit for Boosting Noise or other Channel Quality Metrics

Figure 10B:
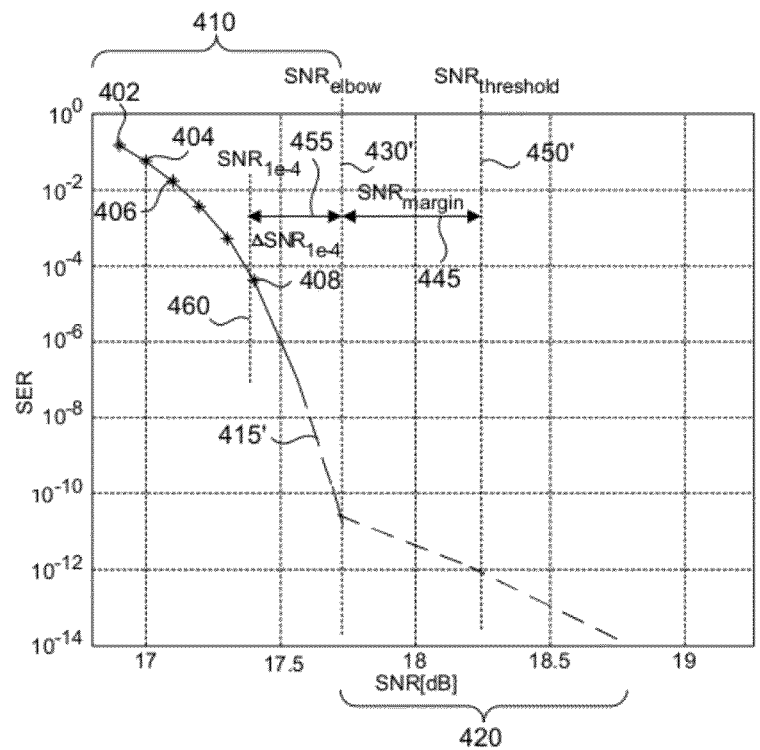

As discussed herein, one can estimate the elbow point and the SNR threshold (or other channel quality metric threshold) by measuring certain sector error rates (SERs) as a function of detector SNR, plotting the curve, and extrapolating the results. FIG. 10B shows a graph 415' of the SER of a storage channel as a function of detector SNR (in dB). Referring to FIGS. 10A-B, in general, SER determinations can be made in the waterfall region 410 of the graph 400, and one may estimate the elbow point 430 and the error floor region 420 from such SER determinations in the waterfall region 410. To do so, one may calculate SERs at an artificially low SNR by boosting the noise in the signal received from the channel.

Figure 11:
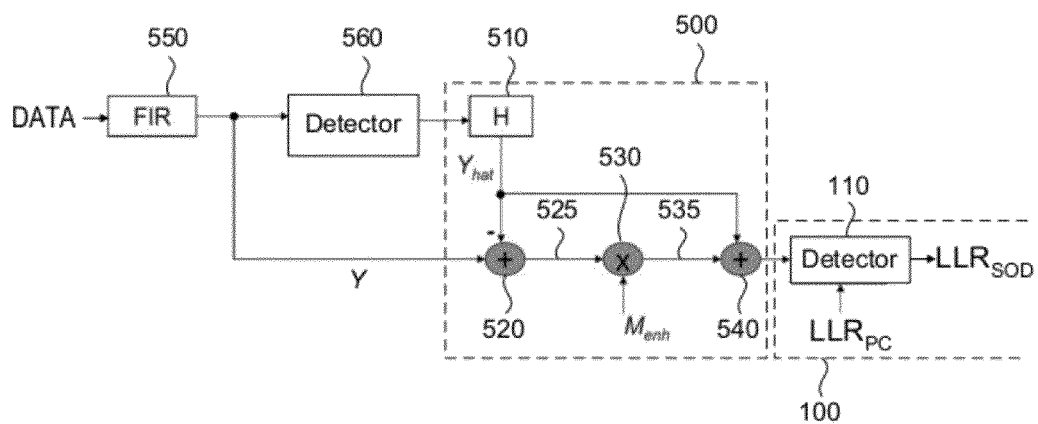
FIG. 11 is a diagram of an embodiment of a noise boosting circuit.

FIG. 11 shows an noise boosting circuit 500, comprising a reconstruction filter 510 and a plurality of mathematical operators 520, 530 and 540, configured to execute a plurality of different mathematical operations. For example, mathematical operator 520 can be an adder configured to execute an addition or subtraction operation, mathematical operator 530 can be a multiplier configured to execute a multiplication operation, and mathematical operator 540 can be a second adder configured to execute a second addition or subtraction operation.

Data is received from the channel and equalized by finite impulse response (FIR) filter 550, then the equalized (digital) data Y is transmitted to both a detector 560 and the noise boosting circuit 500 (in one embodiment, to first adder 520). In one embodiment, the detector 560 can be a simple (e.g., linear) detector, such as a linear Viterbi decoder/detector, for example. In another embodiment, the detector 560 can comprise iterative decoder 100 (see, e.g., FIGS. 2, 5, 6 and 8). After the equalized data Y is iteratively decoded by the detector 560, the reconstruction filter 510 provides an ideal equalized data signal (or target signal) $Y_{hat}$ that has at least some (and usually, most) of the noise in equalized data Y removed. Consequently, equalized data Y and the inverse of the target signal $Y_{hat}$ are added by first adder 520. In another embodiment, equalized data Y is effectively subtracted from the inverse of the target signal $Y_{hat}$ by first adder 520. This first mathematical operation by first adder 520 effectively cancels out the correct data received from the channel, and reconstructs the noise in the channel as identified by the errors in the equalized data signal Y.

Thereafter, the reconstructed noise signal 525 is received by multiplier 530, which multiplies the reconstructed noise signal 525 by a noise enhancement factor $M_{enh}$. The noise enhancement factor $M_{enh}$ can be empirically derived, and generally varies over a range providing a range of SER values of from less than 1 (e.g., about $10^{-1}$) to greater than $10^{-5}$ (e.g., about $10^{-3}$ or $10^{-4}$). To add the data signal back to the enhanced noise signal, the target signal $Y_{hat}$ and the enhanced noise signal 535 are added by second adder 540. Alternatively, the enhanced noise signal 535 can be combined with the equalized data Y. The output of the noise boosting circuit 500 (the noise-boosted data signal) can be fed to iterative decoder 100. The noise-boosted data signal from noise boosting circuit 500 is fed to a detector 110, which in one embodiment can be part of the detector 560.

As mentioned above, the noise boosting circuit 500 can also be applied to any of the other channel quality metrics (e.g., LLRs, number of corrected errors, number of decoding and/or error correction iterations, small error counts, etc.) to effectively increase the sector error rate. If a given detector (e.g., iterative decoder) and storage channel are reliable (e.g., operating at an SNR in the floor region of curve 415 greater than $SNR_{threshold}$), then the noise should be boosted by a relatively large degree to obtain the desired SER data. If the detector and storage channel are less reliable (e.g., operating at an SNR around $SNR_{elbow}$), then the noise can be boosted by a relatively small degree to obtain the desired SER data. The noise boosting circuit 500 can also be useful if one does not have a simulation program for calculating SER as a function of channel quality metric, or does not have simulations that are sufficiently reliable to predict channel behavior as a function of the channel quality metric with reasonable accuracy. Alternatively, one can boost the noise (or the effective sector error rate) by changing (e.g., raising) the fly height of the storage channel read head, by pushing or forcing the read head slightly off-track (e.g., not centered on the storage channel track, but not so far off-center that the read head consistently fails to read data from the channel) by another technique known to those skilled in the art to weaken the signal.

As mentioned above, and referring back to FIG. 10B, the noise can be boosted over a range of SNR values to provide a corresponding set of data points 402, 404, 406 . . . 408. The set of data points 402, 404, 406 . . . 408 should extend over a range of SERs of from less than 1 (e.g., about $10^{-1}$) to greater than $10^{-5}$ (e.g., about $10^{-3}$ or $10^{-4}$). Curve 415' is then plotted (corresponding to 310 in FIG. 9), and the SNR value at $SER=10^{-4}$ ($SNR_{1e-4}$ 460, FIG. 10B) is determined. The elbow point $SNR_{elbow}$ 430' can be estimated (see 320 in FIG. 9) by adding an SNR differential $\Delta SNR_{1e-4}$ 455 to $SNR_{1e-4}$ 460. In general, the SNR differential $\Delta SNR_{1e-4}$ of SER curves such as those shown in FIGS. 10A-10B is constant or characteristic of the type of storage channel, the detector and/or other system structure and/or parameter (e.g., the size of the sector, the code and/or error correction power of the parity bits, etc.). Thereafter, the threshold SNR ($SNR_{threshold}$ 450') can be determined by adding $SNR_{margin}$ 445 to estimated $SNR_{elbow}$ 430' (see 340 in FIG. 9). $SNR_{margin}$ 445 can be estimated or selected as described elsewhere herein.

A Second Method of Qualifying a Channel

An alternative drive qualification procedure is shown in the flow diagram 600 of FIG. 12. This method is particularly useful for qualification when noise characteristics are not very similar across different drives manufactured in the same batch (or across different channels in the same network). The flow 300 disclosed above and shown in FIG. 9 is generally faster than flow 600 of FIG. 12, as process 310 in flow 300 is performed offline, prior to manufacturing (the noise characteristics of all the drives in a given manufacturing lot or from a given manufacturing process are assumed to be similar). In the present application, "similar" noise characteristics (or, perhaps more accurately, noise statistics) may refer to a percentage or proportion of noise components that is the same or similar for all drives in the batch. For example, the percentage or proportion of noise components may be 50% additive-white-Gaussian noise and 50% jitter noise. However, flow 600 of FIG. 12 is generally more reliable than flow 300 in FIG. 9.

Figure 13A:
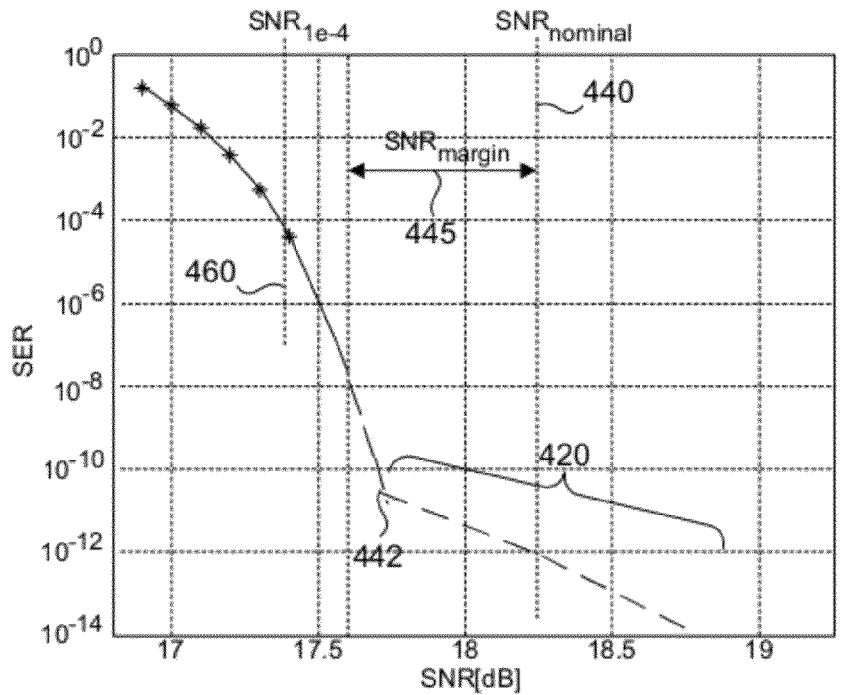
FIGS. 13A-13B are graphs illustrating calculation and/or estimation of certain terms in the flow diagram of FIG. 12.

The storage channel qualification flow 600 of FIG. 12 is also based on the detector SNR quality metric, although it can be applied to other channel quality metrics as well (as described herein). First, at 610 of FIG. 12, the SNR of a given detector-channel system is measured at nominal operating conditions (e.g., by the process disclosed above with regard to a detector SNR quality monitor) to provide a nominal SNR ($SNR_{nominal}$ 440; see FIG. 13A). At 620 of FIG. 12, sector error rates or sector failure rates are determined over a range of noise-boosted SNRs for the given detector-channel system. Noise boosting can be performed as described above with regard to FIG. 10B and FIG. 11. In the alternative flow 600 of FIG. 12, given that noise amplitudes can vary to at least some degree from drive to drive, noise boosting is performed for each drive being qualified. Thereafter, at 630, the sector error rate as a function of detector SNR can be plotted.

For a given drive, at 630, simulations are run and the results plotted against detector SNR. At 640, the detector SNR at a predetermined sector error rate (SER) is determined from the simulations. For example, the detector SNR can be determined at SER=$10^{-4}$ ($SNR_{le-4}$ 460; see FIG. 13A), or alternatively, at SER=$10^{-2}$. These SERs can be achieved via noise boosting with adjustable scaling (a), as described above and where α is equal or equivalent to $M_{enh}$, the noise enhancement factor in FIG. 11.

Referring now to FIG. 12, at 645, in parallel, the SNR margin ($SNR_{margin}$ 445 in FIG. 13A) is determined An acceptable margin ($SNR_{margin}$) may be determined (e.g., empirically and/or according to one or more predetermined criteria), substantially as described herein. In one embodiment, $SNR_{margin}$ 445 is estimated or calculated similarly to the process described with regard to flow 300 in FIG. 9. For example, the elbow point 430' (see FIG. 10B) may be estimated from a LSNR empirically determined for a given code and data read rate. Referring back to FIG. 13A, for one high-rate code example, the elbow point 442 is ~0.3 dB greater than $SNR_{le-4}$ 460 and ~0.6 dB greater than $SNR_{le-2}$. Given the objective of operating in a portion of the error floor region 420 that is at least 1-2 dB greater than the elbow point 442, the $SNR_{margin}$ can correspond to a sum of (the SNR at elbow point 442 minus $SNR_{le-4}$ 460) plus the predetermined and/or desired operating buffer (e.g., 1-2 dB). In this case, the sum of $SNR_{le-4}$ 460 and $SNR_{margin}$ 445 effectively operates as a threshold SNR.

Figure 13B:
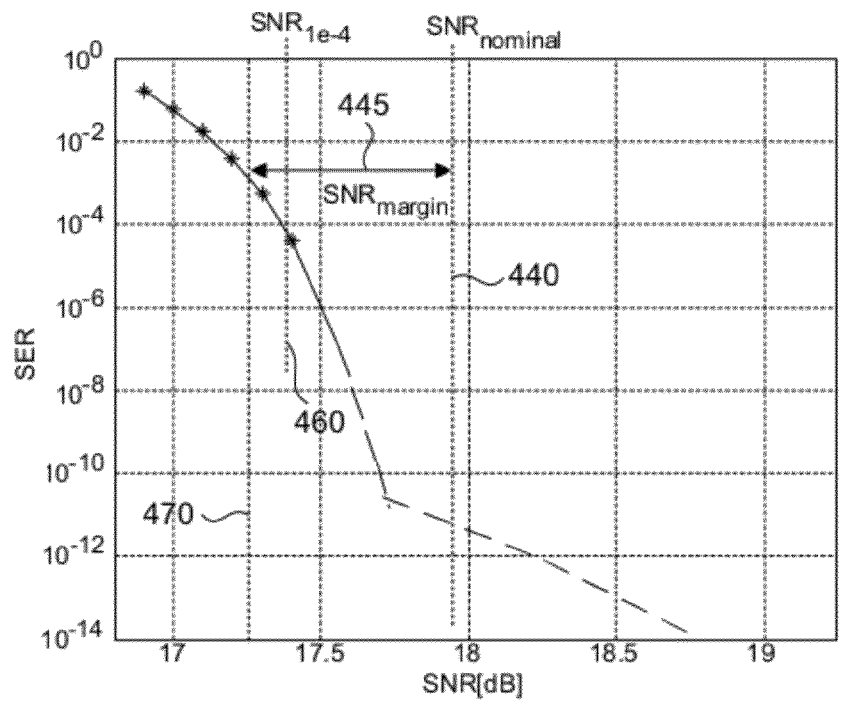

At 650 in FIG. 12, if $SNR_{nominal}$ as determined at 610 is greater than the sum of $SNR_{le-4}$ 460 and $SNR_{margin}$ 445, the storage channel qualifies. On the other hand, and as shown in FIG. 13B, if the SNR 470 equal to $SNR_{nominal}$ 440 minus the $SNR_{margin}$ 445 is less than $SNR_{le-4}$ 460, then the storage channel does not qualify. Alternatively, if one calculates the nominal SNR when α=$α_{MAX}$ (e.g., an α value shown or expected to result in a marginally reliable storage channel having a SER of between 1 and about $10^{-1}$), and the corresponding SER is less than $10^{-4}$, then the storage channel qualifies. Also, if the nominal SNR≧$SNR_{MIN}$ (e.g., an SNR value that is greater than or equal to the SNR at the elbow point 442 plus a predetermined and/or desired operating buffer), then the storage channel can also qualify.

In one embodiment, process 640 is performed off-line, and processes 610, 620, 630 and 645 (and, by definition, process 650) are performed during manufacturing.

Additional Methods of Qualifying a Channel

Generally, storage channel qualification procedures based on LLR counts and/or the LLR probability density function (PDF) are similar to the qualification procedures based on SNR above. Thus, a further alternative qualification method based on the LLR obtained from the initial decoder iteration ($LLR_{INIT}$) is shown in the flow diagram 700 of FIG. 14. The LLR quality monitor described above can be used in the flow 700.

At 710, for a fixed threshold T (representing a maximum LLR count for channel qualification purposes), simulations are run to plot the probability curve as a function of $LLR_{INIT}$ (see, e.g., curves 202, 204, 206 of FIG. 3A) to obtain a series of LLR pdfs. The simulations can apply one or more predetermined values for one or more parameters, such as user bit densities (UBDs), jitter (for a "known" or estimated UBD), SNR, error correction power, etc. The probability can be normalized to an LLR count of 1. Once the LLR pdfs are simulated, at 720 of FIG. 14, an appropriate tail region (e.g., the region of the LLR pdf curve below the $LLR_{INIT}$ at a given LLR threshold; see FIG. 3B and the discussion thereof herein) can be determined. The value of the LLR probability at the selected $LLR_{INIT}$ threshold can effectively be a qualification threshold, $P_{QUAL}$.

For a given iterative decoder-storage channel system, at 730 in FIG. 14, $LLR_{INIT}$ is measured (e.g., using the LLR quality monitor described above and shown in FIG. 2) at an LLR count value below the LLR count threshold T. At 740, if the measured probability P at LLR<T is less than $P_{QUAL}$, then the storage channel qualifies. Otherwise, it does not qualify (but it may qualify using the second LLR-based qualification procedure described below).

Alternatively, the LLR pdf can be calculated for a given iterative decoder-storage channel system, and the calculated LLR pdf can be compared to a threshold LLR pdf simulated for a marginally good channel. If the tail region of the calculated LLR pdf is below the simulated LLR pdf, then the storage channel qualifies. In one further alternative, noise boosting (as described herein) can be used to determine the value of the noise boosting scalar α that can raise the LLR pdf of a given iterative decoder-storage channel system at the threshold $LLR_{INIT}$ to $P_{QUAL}$. If the scalar α that raises the LLR pdf to $P_{QUAL}$ is greater than a margin value of α, then the channel qualifies. In another further alternative, a margin LLR count can be added to the measured LLR value at the threshold $LLR_{INIT}$, and if the probability P is still below $P_{QUAL}$, then the channel qualifies. Otherwise, the channel does not qualify (although it may qualify using the second LLR-based qualification procedure described below).

Figure 15:
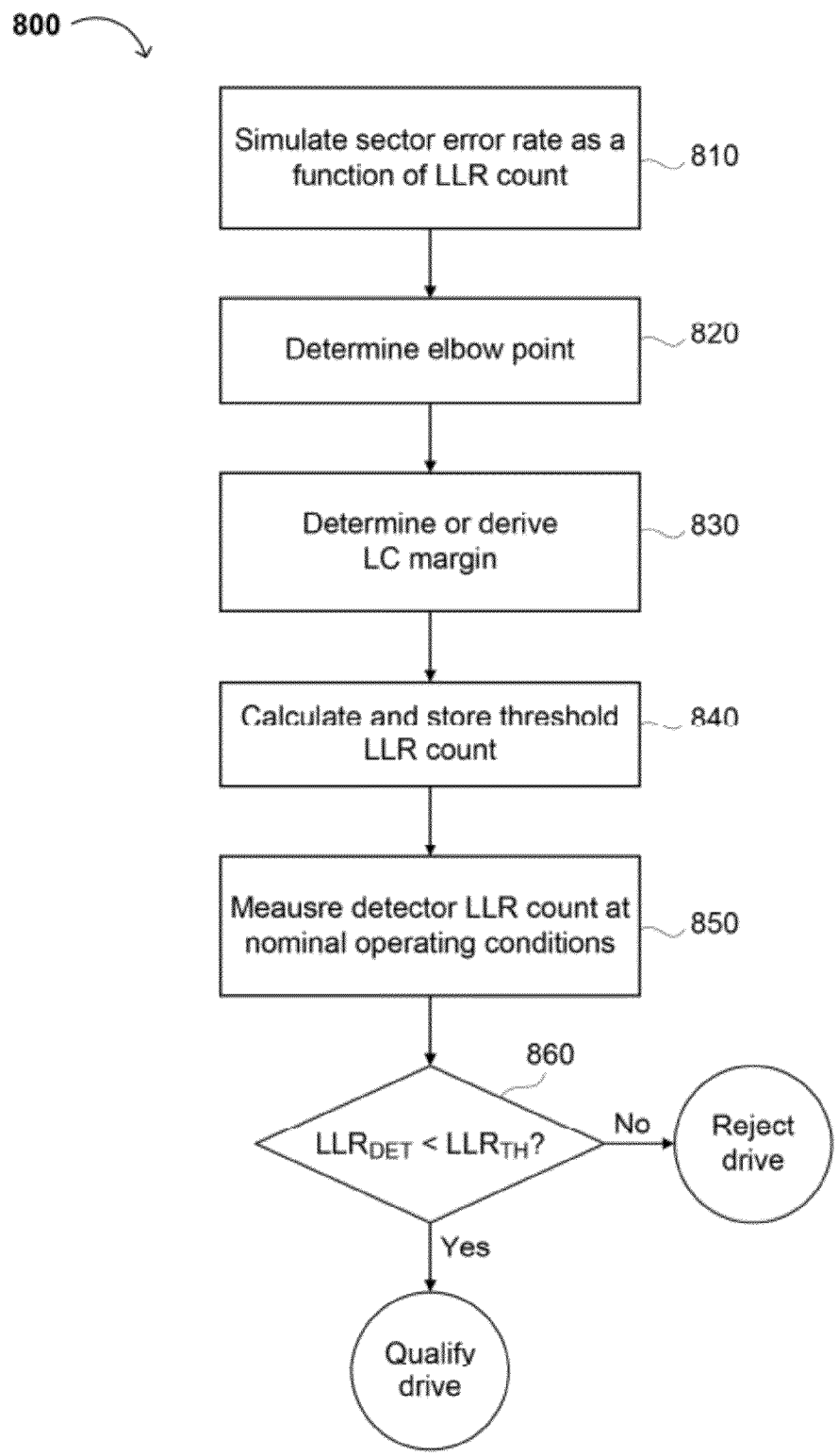
FIG. 15 is a flow diagram of another process for qualifying a storage channel based on LLR information.

A second LLR-based channel qualification procedure is shown in the flow diagram 800 in FIG. 15. The flow 800 of FIG. 15 is quite similar to the flow 300 of FIG. 9. For example, the flow 800 of FIG. 15 is particularly useful where noise or other error induction characteristics do not vary significantly across storage channels manufactured according to a given manufacturing process or technology, and processes 810-840 are done offline while processes 850 and 860 are performed during manufacturing.

In general, at 810, for a given family of storage channels, simulations may be run to determine the sector error rate (SER) as a function of detector LLR count. In one embodiment, the detector LLR count is normalized. Once the simulations are run over a sufficiently broad range of LLR counts (e.g., providing SERs of from less than 1, such as about $10^{-1}$, to less than about $10^{-4}$), at 820, the results can be plotted on a graph, and the elbow point of the SER curve can be identified or estimated.

Figure 16:
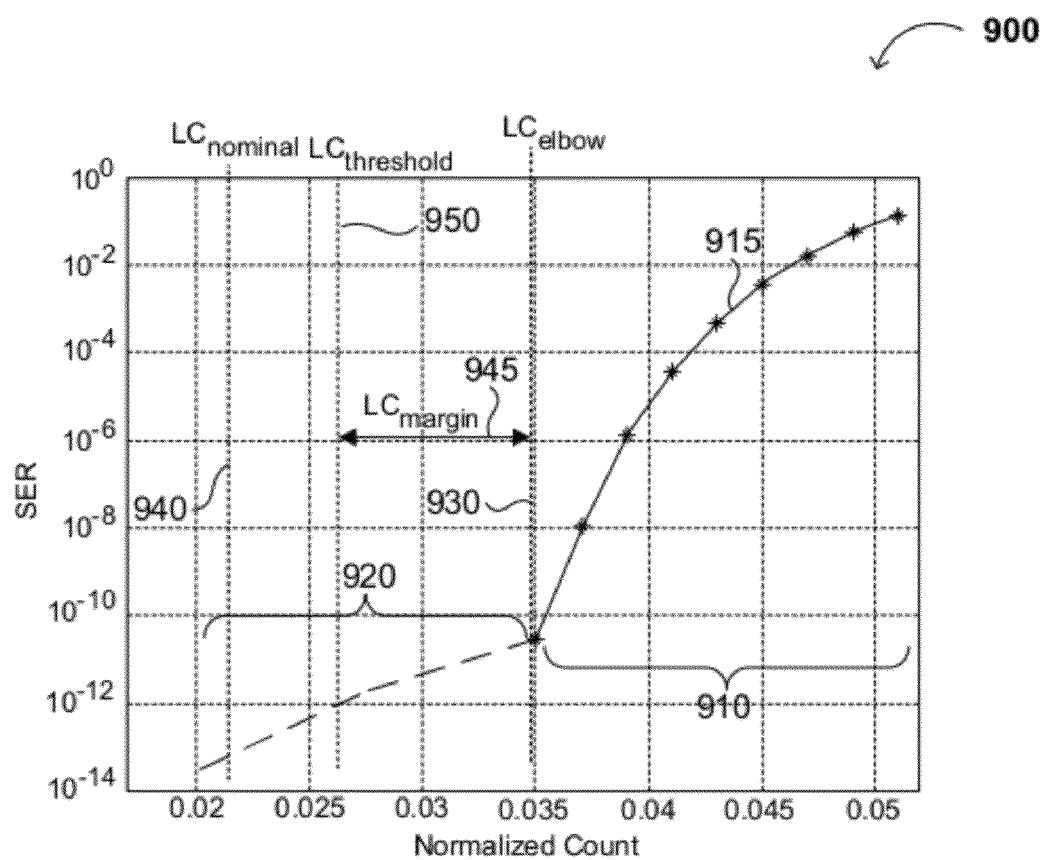
FIG. 16 is a graph illustrating calculation and/or estimation of certain terms in the flow diagrams of FIGS. 14-15.

FIG. 16 shows a graph plotting SER as a function of normalized detector LLR count. Graph 900 shows curve 915 in two regions, the waterfall region 910 and the error floor region 920. The intersection of the waterfall region 910 and the error floor region 920 corresponds to the elbow point in the SER curve, $LLR_{elbow}$ 930.

Ideally, the storage channel operates in a region of the error floor in which the SER is well below the waterfall region (e.g., at least 1 or 2 orders of magnitude). Thus, a threshold LLR count 950 can be selected in accordance with such criteria. Many (if not all) storage media can operate within acceptable limits in an LLR count range close to that of $LLR_{threshold}$ 950. As a result, at 830 in FIG. 15, an acceptable margin ($LLR_{margin}$ 945; see FIG. 16) from $LLR_{elbow}$ 930 is then determined. $LLR_{margin}$ 945 can be selected such that an SER improvement of at least about an order of magnitude is provided, relative to the SER at the elbow point 930 of curve 915. At 840 of FIG. 15, the threshold LLR count for determining reliability of manufactured storage channels is calculated by adding $LLR_{elbow}$ 930 and $LLR_{margin}$ 945, and the value of the threshold LLR count ($LLR_{threshold}$) can be stored in memory (e.g., ROM 150 in FIG. 2).

Referring back to FIG. 15, to determine whether a given storage channel is reliable, at 850, the detector LLR count ($LLR_{nominal}$) is measured or calculated as described herein (e.g., using the LLR quality monitor described herein and shown in FIG. 2), at substantially the same nominal operating condition(s) as used for plotting the graph 915 of FIG. 16. Referring back to FIG. 15, at 860, the storage channel is qualified if $LLR_{nominal} < LLR_{threshold}$. Otherwise, the storage channel is rejected as unreliable.

Software

The present disclosure also includes algorithms, computer program(s) and/or software, implementable and/or executable in a general purpose computer or workstation equipped with a conventional digital signal processor, configured to perform one or more steps of the method and/or one or more operations of the hardware. Thus, a further aspect of the disclosure relates to algorithms and/or software that implement the above method(s). For example, the disclosure may further relate to a computer program, computer-readable medium or waveform containing a set of instructions which, when executed by an appropriate processing device (e.g., a signal processing device, such as a microcontroller, microprocessor or DSP device), is configured to perform the above-described method and/or algorithm.

For example, the computer program may be on any kind of readable medium, and the computer-readable medium may comprise any medium that can be read by a processing device configured to read the medium and execute code stored thereon or therein, such as a floppy disk, CD-ROM, magnetic tape or hard disk drive. Such code may comprise object code, source code and/or binary code.

The waveform is generally configured for transmission through an appropriate medium, such as copper wire, a conventional twisted pair wireline, a conventional network cable, a conventional optical data transmission cable, or even air or a vacuum (e.g., outer space) for wireless signal transmissions. The waveform and/or code for implementing the present method(s) are generally digital, and are generally configured for processing by a conventional digital data processor (e.g., a microprocessor, microcontroller, or logic circuit such as a programmable gate array, programmable logic circuit/device or application-specific [integrated] circuit).

Systems and Network(s)

In a further aspect of the disclosure, the system comprises the present quality monitor and a storage channel in communication with the quality monitor. The quality monitor generally includes an iterative decoder, but in various embodiments, the quality monitor can be selected from an LLR quality monitor, a channel quality monitor, an iterative quality monitor, and iterative convergence quality monitor, an iterative error characteristic quality monitor, and a detector SNR quality monitor, as described herein. In certain embodiments, the quality monitor may further include a noise boosting circuit as described herein.

A further aspect of the disclosure concerns a network, comprising (a) one or more of the present quality monitors; and (b) a plurality of storage devices, wherein each storage device is communicatively coupled to an iterative decoder of the one or more quality monitors. The network may be any kind of known network, such as a storage network (e.g., RAID array), Ethernet, or wireless network. When the network includes a storage network, the storage network may further comprise an array controller configured to control the communications among various components in the network, and/or between the network and external devices. The network may include any known storage device, but preferably, at least a plurality of the coupled devices comprise magnetic (e.g., hard disk) drives.

CONCLUSION/SUMMARY

Thus, embodiments of the present disclosure provide circuitry, architectures, systems and methods for determining channel quality, particularly for storage channels that employ iterative decoding during channel read operations. By employing and/or processing information relating to iterative decoder characteristics or data decoded by the iterative decoder, conventional metrics for determining channel reliability (e.g., the number of corrections performed by the outer RS decoder, or the sector error rate for a given error correction power of an RS code) can be minimized or avoided.

The foregoing descriptions of embodiments of the present disclosure have been presented for purposes of illustration and description. They are not intended to be exhaustive or to limit the disclosure to the precise forms disclosed, and obviously many modifications and variations are possible in light of the above teaching(s). The embodiments were chosen and described in order to best explain the principles of the disclosure and its practical application(s), to thereby enable others skilled in the art to best utilize the disclosure and various embodiments with various modifications as are suited to the particular use contemplated. It is intended that the scope of the disclosure be defined by the claims appended hereto and their equivalents.

What is claimed is:

1. A method of determining reliability of a data storage medium, the method comprising:
   determining, for the data storage medium, a threshold value relating to logarithmic likelihood ratios (LLRs);
   receiving data from the storage medium;
   iteratively decoding the data using LLRs associated with the data;
   determining a LLR-based parameter that is a function of the LLRs that are found to be associated with the data during the iterative decoding; and
   determining a quality of the storage medium based on a comparison of the determined LLR-based parameter to the threshold.

2. The method of claim 1, wherein the threshold and the parameter are in terms of LLR values, and the comparison is based on an absolute value of the LLR values.

3. The method of claim 1, wherein the iterative decoding includes iteratively correcting the data based on the LLRs included in the data, and wherein the LLR of at least some of the data being changed from an initial value to a final value through the course of the iterative decoding.

4. The method of claim 3, wherein the threshold and the parameter are in terms of difference between initial LLR values and final LLR values in the iterative decoding.

5. The method of claim 3, wherein the parameter relates to initial LLR values determined in the iterative decoding and do not relate to final LLR values determined in the iterative decoding.

6. The method of claim 3, wherein the parameter relates to final LLR values determined in the iterative decoding and do not relate to initial LLR values determined in the iterative decoding, and wherein the parameter relates to the number of times the error count exceeds a predetermined value.

7. The method of claim 3, wherein the parameter is in terms of a number of iterations performed in the iterative decoding.

8. The method of claim 3, wherein the parameter is a measure of a total number of decoding iterations used to correct errors.

9. The method of claim 1, wherein the parameter is in terms of a probability density of a LLR value for the storage device, and wherein the threshold is determined based on a probability density function of probability verses LLR.

10. The method of claim 1, wherein the storage medium is a hard drive, a hard disk, an optical disk, or a solid state memory.

11. A system for determining reliability of a data storage medium, the system comprising:
 a memory configured to store, for the data storage medium, a threshold value relating to logarithmic likelihood ratios (LLRs);
 an iterative decoder configured to
  receive data from the storage medium,
  iteratively decode the data using LLRs associated with the data, and
  determine a LLR-based parameter that is a function of the LLRs that are found to be associated with the data during the iterative decoding; and
 a comparator logic configured to compare the determined LLR-based parameter to the threshold to determine a quality of the storage medium.

12. The system of claim 11, wherein the threshold and the parameter are in terms of LLR values, and the comparison is based on absolute value of the LLR values.

13. The system of claim 11, wherein the iterative decoding includes iteratively correcting the data based on the LLRs included in the data, and wherein the LLR of at least some of the data being changed from an initial value to a final value through the course of the iterative decoding.

14. The system of claim 13, wherein the threshold and the parameter are in terms of difference between initial LLR values and final LLR values in the iterative decoding.

15. The system of claim 13, wherein the parameter relates to initial LLR values determined in the iterative decoding and do not relate to final LLR values determined in the iterative decoding.

16. The system of claim 13, wherein the parameter relates to final LLR values determined in the iterative decoding and do not relate to initial LLR values determined in the iterative decoding, and wherein the parameter relates to the number of times the error count exceeds a predetermined value.

17. The system of claim 13, wherein the parameter is in terms of a number of iterations performed in the iterative decoding.

18. The system of claim 13, wherein the parameter is a measure of a total number of decoding iterations used to correct errors.

19. The system of claim 11, wherein the parameter is in terms of a probability density of a LLR value for the storage device, and wherein the threshold is determined based on a probability density function of probability verses LLR.

20. The system of claim 11, wherein the storage medium is a hard drive, a hard disk, an optical disk, or a solid state memory.

* * * * *